United States Patent
Ancheta et al.

(10) Patent No.: US 11,081,366 B2
(45) Date of Patent: Aug. 3, 2021

(54) MCM PACKAGE ISOLATION THROUGH LEADFRAME DESIGN AND PACKAGE SAW PROCESS

(71) Applicant: Texas Instruments Incorporated, Dallas, TX (US)

(72) Inventors: Bernard Kaebin Andres Ancheta, Quirino (PH); Emerson Mamaril Enipin, Angeles (PH); John Carlo Cruz Molina, Bataan (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/210,095

(22) Filed: Dec. 5, 2018

(65) Prior Publication Data

US 2020/0185234 A1 Jun. 11, 2020

(51) Int. Cl.
| | |
|---|---|
| H01L 21/48 | (2006.01) |
| H01L 23/495 | (2006.01) |
| H01L 25/065 | (2006.01) |
| H01L 23/00 | (2006.01) |
| H01L 21/56 | (2006.01) |

(52) U.S. Cl.
CPC ........ *H01L 21/4842* (2013.01); *H01L 21/565* (2013.01); *H01L 23/49503* (2013.01); *H01L 23/49548* (2013.01); *H01L 24/49* (2013.01); *H01L 25/0655* (2013.01)

(58) Field of Classification Search
CPC ............. H01L 23/49503; H01L 21/565; H01L 23/49548; H01L 23/49575; H01L 21/561; H01L 25/0655; H01L 24/49; H01L 21/4842; H01L 2224/48091
See application file for complete search history.

(56) References Cited

U.S. PATENT DOCUMENTS

| | | | |
|---|---|---|---|
| 8,022,522 B1* | 9/2011 | Liou | ........................ H01L 21/50 257/686 |
| 8,883,567 B2 | 11/2014 | Wyant et al. | |
| 2002/0121680 A1* | 9/2002 | Ahn | .................. H01L 23/49575 257/666 |
| 2017/0125324 A1 | 5/2017 | Joshi et al. | |
| 2017/0170101 A1 | 6/2017 | Arguelles et al. | |

* cited by examiner

*Primary Examiner* — Jasmine J Clark
(74) *Attorney, Agent, or Firm* — Ronald O. Neerings; Charles A. Brill; Frank D. Cimino

(57) ABSTRACT

A method of making a semiconductor device includes mounting at least two semiconductor dies to a die pad of a leadframe in spaced apart relation to each other, the leadframe having a plurality of preformed leads, electrically connecting each semiconductor die to at least one preformed lead of the leadframe, forming a molding structure including at least part of the semiconductor dies and the preformed leads of the leadframe, and forming a trench in the molding structure in a space between the at least two semiconductor dies, the trench separating the die pad into first and second die pad portions.

20 Claims, 5 Drawing Sheets

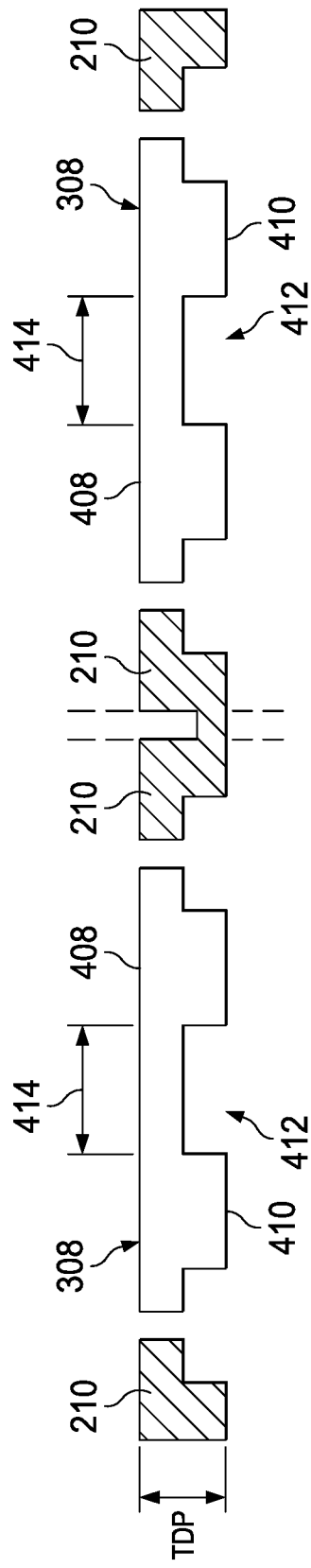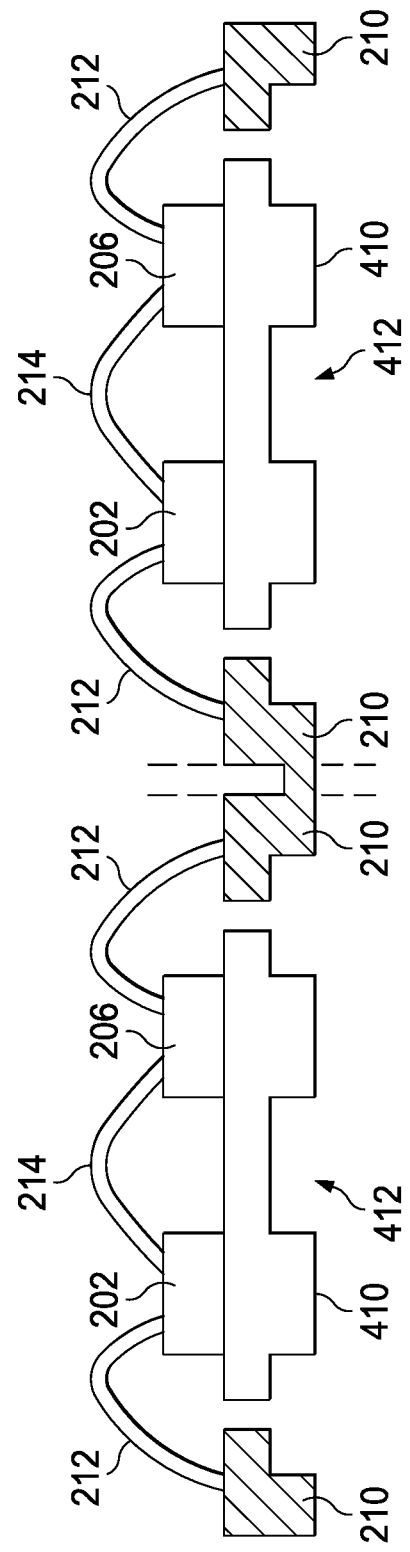

US 11,081,366 B2

MCM PACKAGE ISOLATION THROUGH LEADFRAME DESIGN AND PACKAGE SAW PROCESS

BACKGROUND

Conventional leadframe semiconductor devices having multiple die pads each supporting a semiconductor die are fabricated using pre-molded or pre-taped leadframes. The pre-molded or pre-taped leadframes are utilized to provide sufficient die pad support during fabrication. While the pre-molded or pre-taped leadframes provide sufficient die pad support during fabrication, such pre-molded or pre-taped leadframes are more expensive than plain leadframes.

SUMMARY

Aspects of the disclosure provide a method to fabricate a semiconductor device including mounting at least two semiconductor dies to a die pad of a leadframe in spaced apart relation to each other, the leadframe having a plurality of preformed leads, electrically connecting each semiconductor die to at least one preformed lead of the leadframe, forming a molding structure including at least part of the semiconductor dies and the preformed leads of the leadframe, and forming a trench in the molding structure in a space between the at least two semiconductor dies, the trench separating the die pad into first and second die pad portions.

Described examples include a semiconductor device comprising a leadframe having a die pad and a plurality of preformed leads, first and second semiconductor dies mounted to first and second die pad portions, each of the first and second semiconductor dies electrically connected to at least one preformed lead, a molding material encapsulating at least a portion of the leadframe and the first and second semiconductor dies, and a trench separating the die pad into the first and second die pad portions.

BRIEF DESCRIPTION OF THE DRAWINGS

FIG. 4 is a cross-sectional view of the leadframe panel taken along line 4-4 of FIG. 3.

FIGS. 5-8 are cross-sectional views of the leadframe panel at different stages of fabrication processing according to the method of FIG. 1.

DETAILED DESCRIPTION

Figure 1:
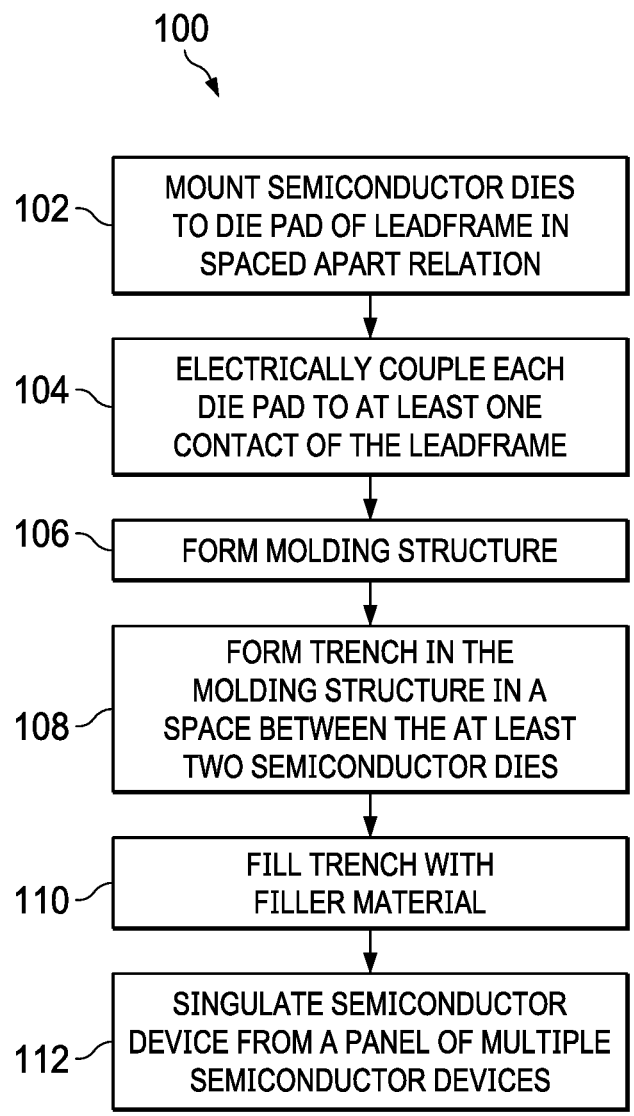
FIG. 1 is a flow diagram showing a method for making a semiconductor device in accordance with the present disclosure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. The various features of the disclosed examples can be used in connection with a variety of different semiconductor devices, including without limitation integrated circuits having multiple electronic components, as well as single component semiconductor devices (e.g., single transistor products, single diode products, etc.).

Figure 2:
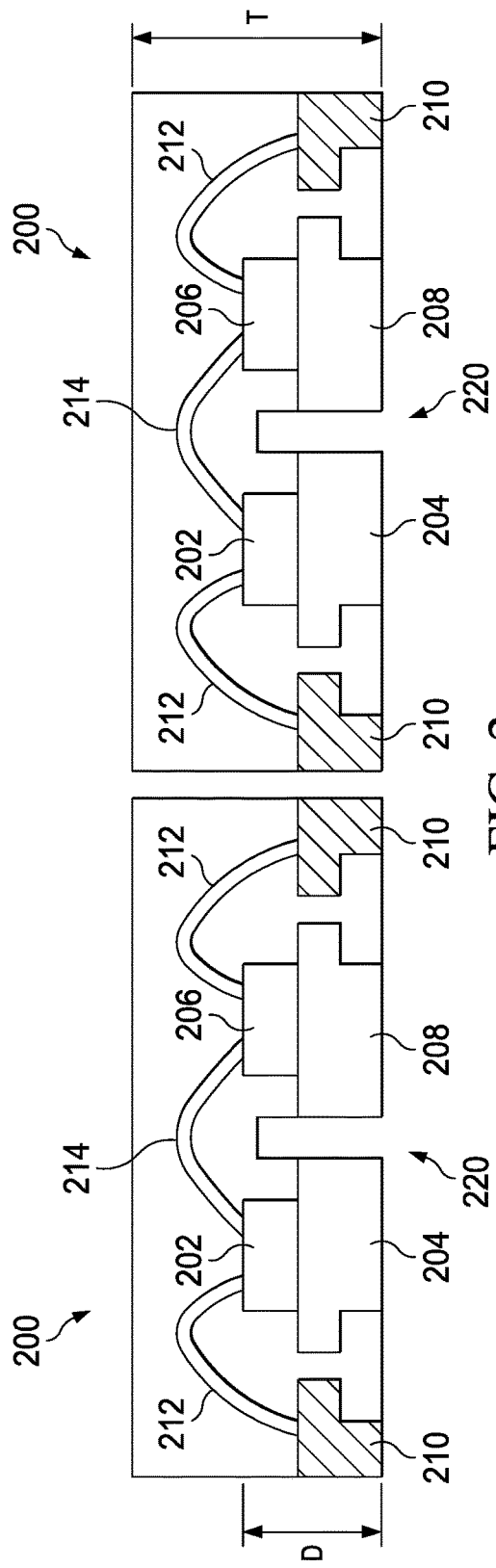
FIG. 2 is cross-sectional view of two example semiconductor devices in accordance with the present disclosure.

Referring initially to FIGS. 1 and 2, an example method 100 for fabricating a semiconductor device 200 in accordance with the present disclosure is shown. The method 100 begins at 102, where first and second semiconductor dies are mounted to a die pad of a leadframe in spaced apart relation. The leadframe can be part of a panel of multiple leadframes, each having a die pad and a plurality of preformed contacts. Two semiconductor dies are mounted in spaced apart relation on a die pad of single leadframe, but it will be understood that more than two semiconductor dies can be mounted to a single die pad in spaced apart relation without departing from the scope of this disclosure. Mounting the semiconductor dies in spaced apart relation allows the die pad to be separated into (at least) first and second electrically isolated die pad portions each having a semiconductor die supported thereon during subsequent processing steps.

At 104, the first and second semiconductor dies are electrically coupled to at least one preformed contact of the leadframe. In one example, the electrical coupling can be by wirebonding, flipchip, or any other suitable manner of electrically connecting the semiconductor dies with the preformed contacts.

At 106, a molding structure is formed. The molding structure generally includes at least a portion of the semiconductor dies and at least a portion of the preformed contacts encapsulated/enclosed by a molding compound. Any suitable material can be used for forming the molding structure, such as epoxy, resin, or the like.

At 108, a trench is formed in the molding structure in a space between the first and second semiconductor dies. The trench has a depth and a position so as to separate the die pad into first and second die pad portions, each die pad portion supporting a semiconductor die. In some embodiments, the trench extends approximately halfway through a thickness of the molding structure. In one example, the trench is formed through at least a portion of the molding compound and at least a portion of the die pad. In other embodiments, the trench may only extend through the die pad, and not necessarily through any of the molding compound of the molding structure.

In one example, the trench is formed through a reduced cross-sectional thickness portion of the die pad. The semiconductor dies are mounted to the die pad on opposite sides of the reduced cross-sectional thickness portion such that the reduced cross-sectional thickness portion of the die pad is generally located in the space between the spaced-apart semiconductor dies. This reduces the amount of conductive material that must be removed to form the trench/separate the die pad into first and second die pad portions. The reduced cross-sectional thickness portion can be, in some embodiments, a half-etched die pad having a trench extending in a plane perpendicular to the thickness dimension of the die pad. The trench can be on either face of the die pad (e.g., a face on which the semiconductor dies are mounted, or an opposite face).

In one example, the trench is filled at 110 with a filler material (e.g., filler resin) to seal the trench and/or provide a planar surface. In other implementations the filling at 110 is omitted. Although the trench can be filled with a filler material, it is still referred to as a trench in this description whether it is filled or unfilled.

At 112, individual semiconductor devices are singulated from the panel of multiple semiconductor devices, such as by sawing.

FIG. 2 shows two representative individual semiconductor devices 200 made in accordance with example method 100 are illustrated. Any number of semiconductor devices 200 can be made in accordance with aspects of the present disclosure.

Each semiconductor device 200, in one example, includes a first semiconductor die 202 mounted on a first die pad portion 204 and a second semiconductor die 206 mounted on a second die pad portion 208. Each semiconductor die 202 and 206 in this example is electrically coupled to at least one preformed contact or lead 210 via bond wires 212. The semiconductor dies 202 and 206 are also electrically coupled to each other by a bond wires 214.

An enclosure is formed by a molding compound 218 that encapsulates the semiconductor dies 202 and 206, bond wires 212 and 214, at least a portion of the preformed leads 210, and at least a portion of the first and second die pad portions 204 and 208. A trench 220 electrically isolates the first and second die pad portions 204 and 208. The trench 220 in the illustrated embodiment has a depth D that corresponds to approximately half of a thickness T of the semiconductor device 200. However, in other embodiments the trench 220 can have a different depth. In one example, the trench 220 is formed by removing at least a portion of the conductive material of the die pad of the leadframe to separate the die pad into the first and second die pad portions 204 and 208.

Figure 3:
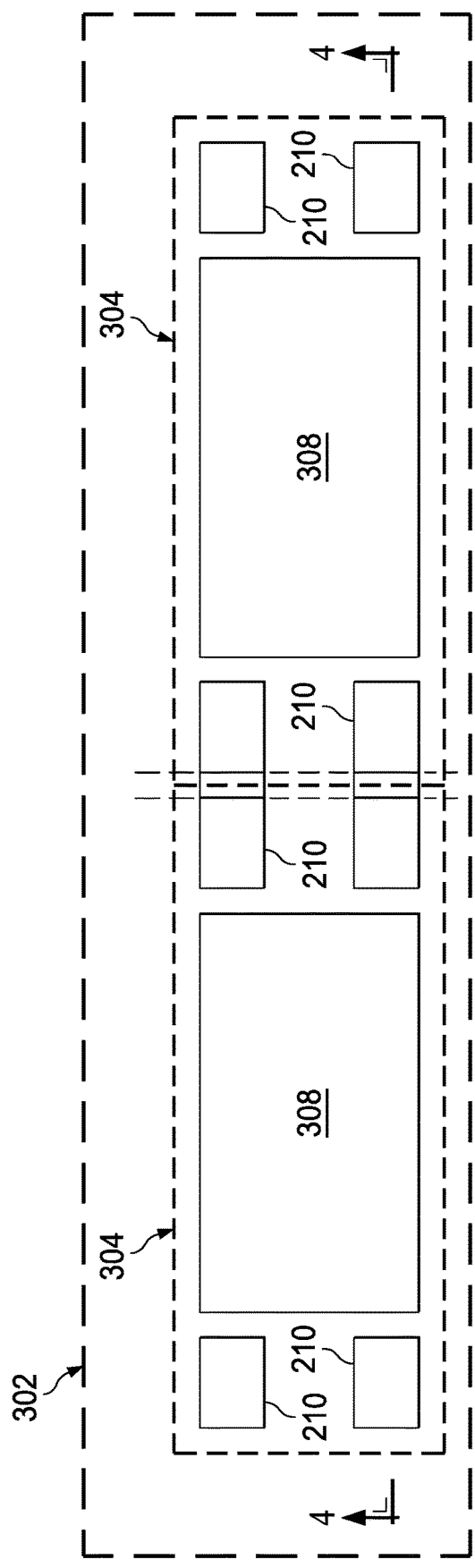
FIG. 3 is a partial top plan view of a panel of leadframes prior to undergoing fabrication processing according to the method of FIG. 1.

FIGS. 3-8 show the various stages of forming the semiconductor devices 200. In FIG. 3, a portion of a panel 302 of multiple leadframes 304 is illustrated. The panel 302 can include a leadframe array of virtually any size, and FIGS. 3-8 show two example leadframes 304 as part of the panel 302. Each leadframe 302 in this example includes at least one die pad 308 and multiple preformed leads 210. For simplicity, preformed leads 210 are only shown on the sides of the die pad 308 but additional preformed leads may surround the die pad 308. Prior to singulation of the semiconductor dies from the panel 302 (e.g., 112 in FIG. 1), the preformed leads of adjacent leadframes 304 may be a common conductive structure that is subsequently severed during the singulation step. In one example, the preformed leads of adjacent leadframes may be separate conductive structures prior to singulation.

As shown in the example of FIG. 4, each die pad 308 has a generally planar upper surface 408 upon which the first and second semiconductor dies 202 and 206 are mounted, while a lower surface 410 of each die pad 308 has a trench 412. Trench 412 is centrally located and extends in a plane perpendicular to a thickness dimension T of the die pad 308. The trench 412 results in a reduced cross-sectional thickness portion 414 of the die pad 308. The trench 412 in one example is formed by etching the conductive material of the die pad 308, or by other suitable methods. The trench 220 in one example is ultimately formed through the reduced cross-sectional thickness portion 414 of the die pad 308 so as to separate the die pad 308 into first and second die pad portions 204 and 208.

In FIG. 5, the semiconductor dies 202 and 206 are mounted to the upper surface 408 of the die pad 308 (e.g., 102 and 104 in FIG. 1). Each semiconductor die 202 and 206 in one example is electrically coupled to one or more preformed leads 210 via bond wires 212. The semiconductor dies 202 and 206 are also electrically connected to each other via one or more bond wires 214.

Figure 6:
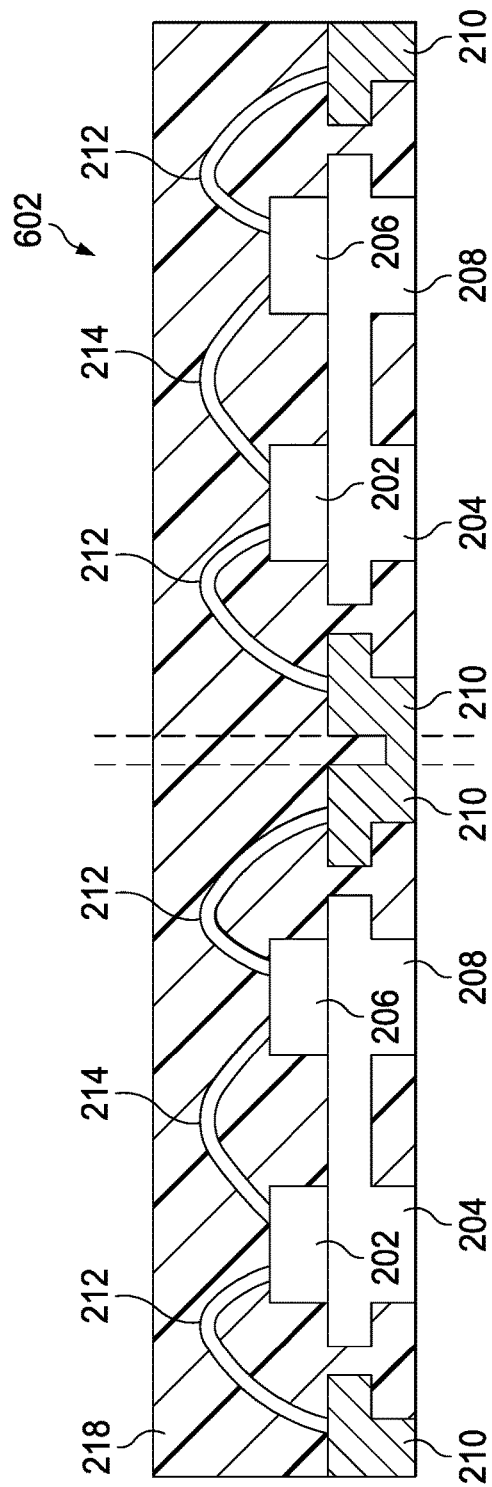

In FIG. 6, a molding structure 602 is formed (e.g., 106 in FIG. 1). In one example, the molding compound 218 is applied and encapsulates the semiconductor dies 202 and 206, bond wires 212 and 214, at least a portion of the preformed contacts 210, and at least a portion of the first and second die pad portions 204 and 208. In one example, the molding compound 218 at least partially fills the trench 412.

Figure 7:
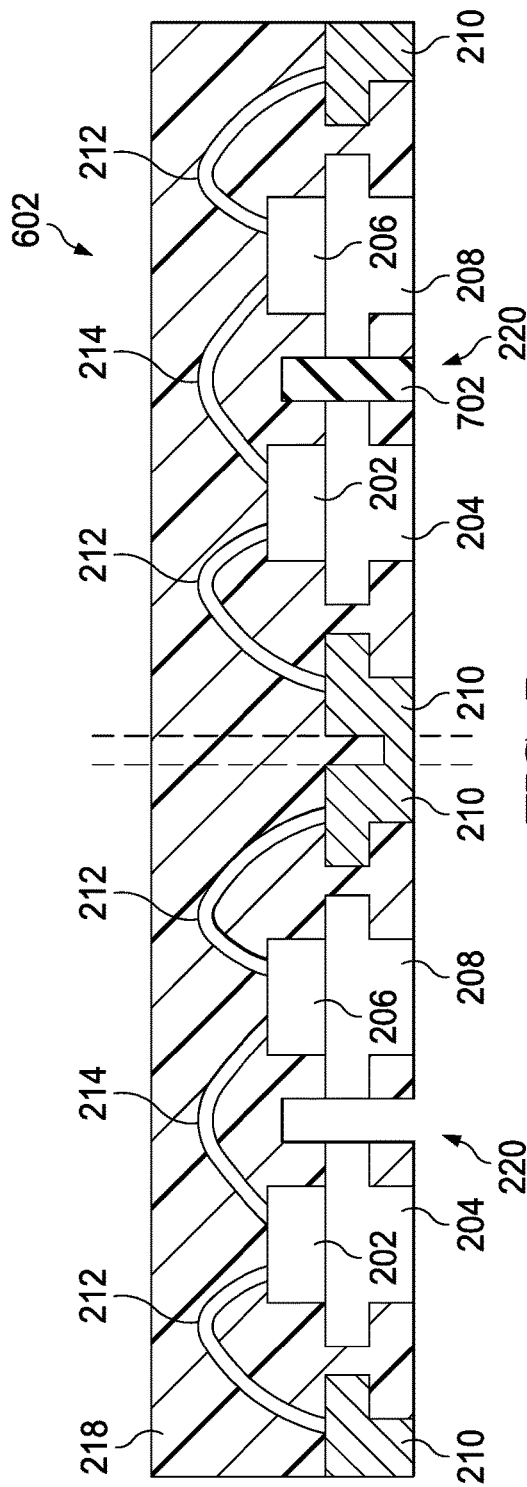

In FIG. 7, the trench 220 is formed (e.g., 108 in FIG. 1). In one example, the trench 220 extends through the reduced cross-sectional thickness portion 414 of the die pad 308 and thereby separates the die pad 308 into first and second die pad portions 204 and 208. One method of forming the trench 220 is with a tape saw that is configured to saw approximately half-way through a thickness of the molding structure 602. By forming the trench 220 at the reduced cross-sectional thickness portion 414 of the die pad 308, the amount of wear on the tape saw is minimized as compared to forming the trench through a relatively thicker portion of the die pad 308, as would be the case if trench 412 did not exist and the die pad 308 had a uniform thickness. That is, the amount of conductive material that must be removed by the tape saw in order to separate the die pad 308 into two die pad portions is minimized or reduced by sawing through the reduced cross-sectional thickness portion 414 of the die pad 308.

In various implementations, the relative dimensions of the overall thickness of the die pad 308 and the reduced cross-sectional thickness portion 414 formed by the trench 412 can be optimized to provide increased tape saw life while maintaining die pad support during fabrication processes. In one example, the reduced cross-sectional thickness portion 414 has a thickness that is approximately half of the overall thickness T of the die pad 308. In other examples, the reduced cross-sectional thickness portion can be more or less than half of the overall thickness of the die pad 308. In other examples, the reduced cross-sectional thickness portion can be eliminated, and the trench 412 can be formed through the full thickness of the die pad 308.

After forming the trench 220, the trench 220 in one example is filled with a filler material 702, as shown for example on the right side of FIG. 7 (e.g., 108 in FIG. 1). In other examples, the filler material is omitted.

Figure 8:
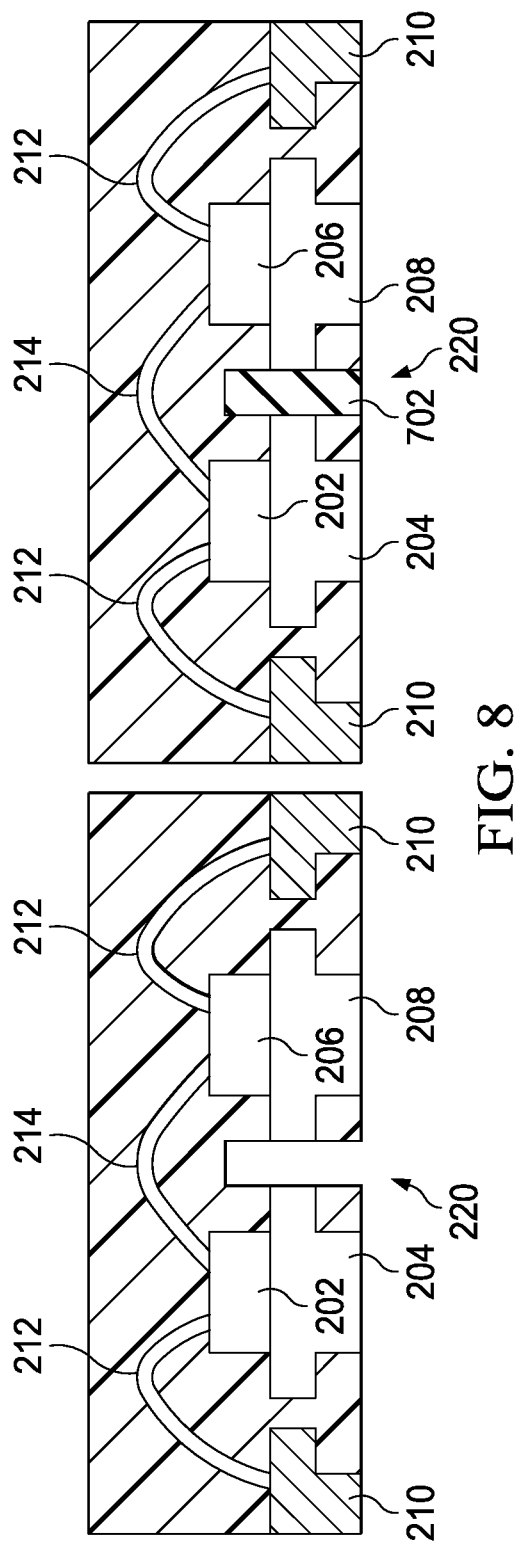

In FIG. 8, the devices 200 are singulated (e.g., as in process step 112) by separating the devices 200 from the panel 302, including cutting through the common conductive structure forming preformed leads 210 of each leadframe 304. Singulation can be performed in any suitable manner, such as with a tape saw or other saw.

The reduced thickness portion 414 of the die pad 308 of the leadframe 304 can be formed in one example by a trench in the top surface 410 of the die pad 308, as opposed to the trench 410 of the examples of FIGS. 2-8 which is formed in the bottom surface 410 of the die pad 308.

Figure 9:
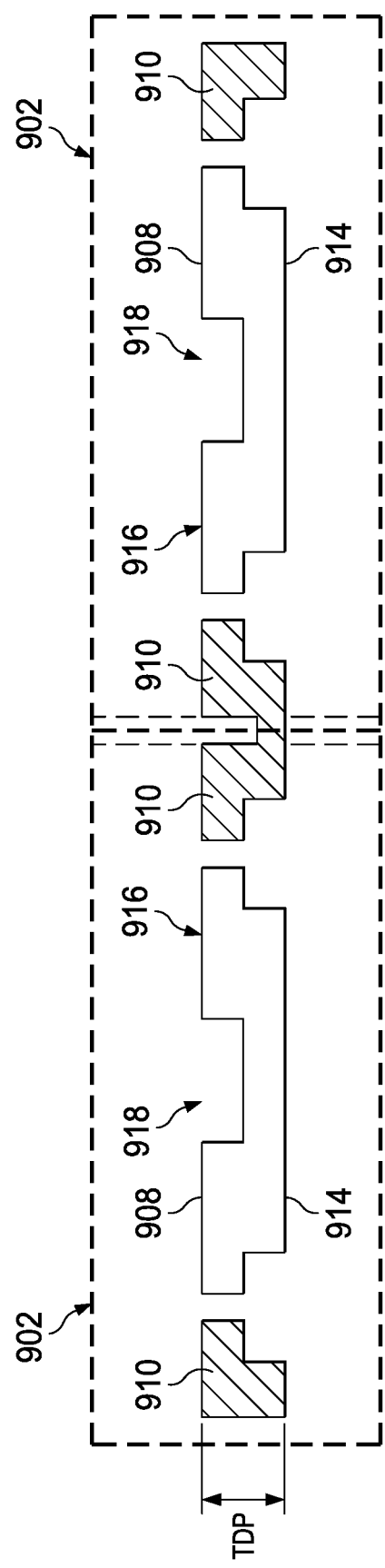
FIG. 9 is a cross-sectional view of another leadframe configuration prior to undergoing fabrication processing according to the method of FIG. 1.

FIG. 9 shows first and second leadframes 902 having such configuration. The leadframes 902 can be part of a panel of leadframes (e.g., panel 302) and can be substituted directly for leadframes 304 in the device and process described in connection with FIGS. 1-8 without otherwise modifying such device and process.

Each leadframe 902 in one example includes at least one die pad 908 and multiple preformed leads 910. Each die pad 908 in this example has a generally planar lower surface 914, and an upper surface 916 upon which first and second semiconductor dies can be mounted on opposing sides of a trench 918. Trench 918 is centrally located and extends in a plane perpendicular to a thickness dimension TDP of the die pad 908. The trench 918 results in a reduced cross-sectional thickness portion 918 of the die pad 908. The trench 918 can be formed by etching the conductive material of the die pad 908, or by other suitable methods.

The leadframes 902 can be otherwise processed in a similar manner to the leadframes 302 of FIGS. 1-8 to produce semiconductor devices having at least two electrically isolated die pads/semiconductor dies in accordance with the present disclosure.

Aspects of the present disclosure provide a method to produce semiconductor packages having multiple semiconductor dies supported on respective die pad portions that facilitates full support of the die pads during package processing, without the use of pre-molded or pre-taped leadframes. Aspects of the present disclosure can be implemented to provide a more cost-effective solution for manufacturing semiconductor packages having multiple semiconductor dies.

Modifications are possible in the described embodiments, and other embodiments are possible, within the scope of the claims.

The following is claimed:

1. A semiconductor device, comprising:
   a leadframe having a die pad and a plurality of preformed leads;
   first and second semiconductor dies mounted to the die pad, each of the first and second semiconductor dies electrically connected to at least one preformed lead;
   a molding compound covering at least a portion of the leadframe and the first and second semiconductor dies; and
   a trench in a space between the first and second semiconductor dies separating the die pad into first and second die pad portions.

2. The semiconductor device of claim 1, wherein the trench extends through the die pad and at least a portion of the molding compound.

3. The semiconductor device of claim 1, wherein the die pad includes a first side on which the first and second semiconductor dies are mounted, and a second side opposite the first side, and wherein the trench opens to the second side of the die pad.

4. The semiconductor device of claim 1, wherein the semiconductor device has a thickness, and wherein the trench has a depth that is approximately half of the thickness of the semiconductor device.

5. The semiconductor device of claim 1, further comprising a filler material disposed in the trench.

6. A packaged semiconductor device, comprising:
   a leadframe, including:
      a die pad with a first die pad portion and a second die pad portion, and
      a plurality of leads;
   a first semiconductor die mounted to the first die pad portion,
   a first bond wire that electrically connects the first semiconductor die to a first one of the plurality of leads;
   a second semiconductor die mounted to the second die pad portion, the second semiconductor die electrically connected to a second one of the plurality of leads;
   a second bond wire that electrically connects the second semiconductor die to a second one of the plurality of leads; and
   a trench that separates the first die pad portion and the second die pad portion.

7. The packaged semiconductor device of claim 6, further comprising a filler material disposed in the trench.

8. The packaged semiconductor device of claim 7, wherein the trench extends through the die pad and at least a portion of the molding compound.

9. The packaged semiconductor device of claim 6, wherein the trench extends through the die pad and at least a portion of the molding compound.

10. The packaged semiconductor device of claim 6, wherein the die pad includes a first side on which the first and second semiconductor dies are mounted, and a second side opposite the first side, and wherein the trench opens to the second side of the die pad.

11. The method of claim 6, further comprising disposing a filler material in the trench.

12. The method of claim 11, wherein the trench extends through the die pad and at least a portion of the molding compound.

13. A method of making a semiconductor device, comprising:
   providing a leadframe having a die pad and a plurality of preformed leads;
   mounting first and second semiconductor dies to the die pad, each of the first and second semiconductor dies electrically connected to at least one preformed lead;
   covering at least a portion of the leadframe and the first and second semiconductor dies with a molding compound; and
   separating the die pad into first and second die pad portions with a trench between the first and second semiconductor dies.

14. The method of claim 13, wherein the trench extends through the die pad and at least a portion of the molding compound.

15. The method of claim 13, wherein the die pad includes a first side on which the first and second semiconductor dies are mounted, and a second side opposite the first side, and wherein the trench opens to the second side of the die pad.

16. The method of claim 13, wherein the semiconductor device has a thickness, and wherein the trench has a depth that is approximately half of the thickness of the semiconductor device.

17. The method of claim 13, further comprising a disposing a filler material in the trench.

18. A method of making a packaged semiconductor device, comprising:
   providing a leadframe, including:
      a die pad with a first die pad portion and a second die pad portion, and
      a plurality of leads;
   mounting a first semiconductor die to the first die pad portion,
   electrically connecting the first semiconductor die to a first one of the plurality of leads with a first bond wire;
   mounting a second semiconductor die to the second die pad portion,
   electrically connecting the second semiconductor die to a second one of the plurality of leads with a second bond wire; and separating the first die pad portion and the second die pad portion with a trench.

19. The method of claim 18, wherein the die pad includes a portion thereof having a reduced thickness, and wherein the trench extends through the reduced thickness portion at a position between the first and second die pad portions.

20. The method of claim 18, wherein the die pad includes a first side on which the first and second semiconductor dies are mounted, and a second side opposite the first side, and wherein the trench opens to the second side of the die pad.

* * * * *